Dec. 21, 1971 I. W. WOLF ET AL 3,629,388
CASTING PROCEDURE FOR HIGH QUALITY EPOXY LAYERS
Filed Jan. 12, 1970
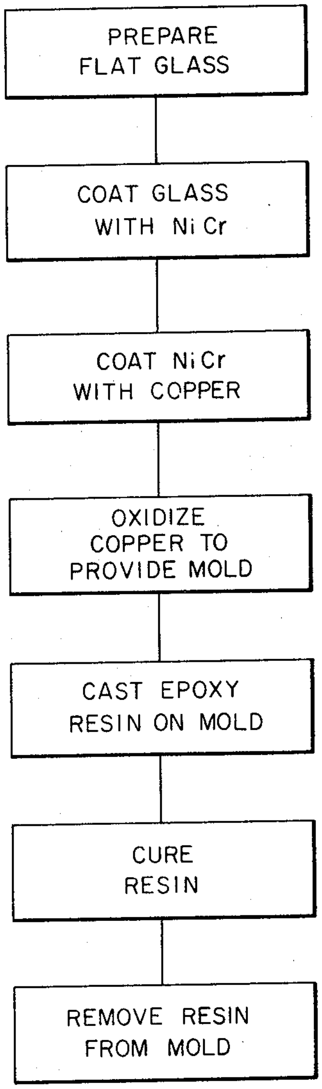
INVENTORS
MOSES I. LEVITSKY, DECEASED
BY ROSANNE A. LEVITSKY, ADMINISTRATRIX
IRVING W. WOLF
HEINZ LIENHARD
BY Robert H. Clay
ATTORNEY

United States Patent Office 3,629,388
Patented Dec. 21, 1971

3,629,388

CASTING PROCEDURE FOR HIGH QUALITY EPOXY LAYERS

Irving W. Wolf and Heinz Lienhard, Palo Alto, Calif., and Moses I. Levitsky, deceased, late of Palo Alto, Calif., by Rosanne A. Levitsky, administratrix, Palo Alto, Calif., assignors to Ampex Corporation, Redwood City, Calif.

Filed Jan. 12, 1970, Ser. No. 2,077
Int. Cl. B29c *1/04*
U.S. Cl. 264—219 5 Claims

ABSTRACT OF THE DISCLOSURE

A precision epoxy resin structure is prepared by casting an epoxy resin on a mold of oxidized copper or silver. The method is particularly adapted for making flat epoxy substrates for closed flux storage elements.

SUMMARY OF THE INVENTION

In many electronic applications it is desirable to have a large, flat insulating member. As an example, in the co-pending application of one of us, Ser. No. 641,293, filed May 25, 1967, now U.S. Pat. 3,553,660 there is described a method of making a closed flux storage element having magnetic films separated by an electrical conductor. Such memory elements are ordinarily made by first depositing a plurality of layers of conducting and magnetic elements on an insulating substrate and then by a photo resist process, etching away certain portions of the structure leaving a large number of individual memory elements on the substrate. In the past it has been proposed to use a glass substrate but the glass used for such purposes must of necessity be quite thin and it is subject to flexing and surface irregularities.

It has been proposed to remedy this by substituting an epoxy resin as the substrate. However, it has been difficult to obtain a flat surface on an epoxy resin since the epoxy resins give an excellent bond to almost all materials making it difficult to find a mold material which will be easily separated from the epoxy surface and leave the epoxy surface in good condition. Those materials which were previously known for use as epoxy molds are not suitable for precision applications.

In accordance with the present invention, it has been found that a well oxidized copper or silver surface provides an excellent interface to the epoxy resin. The epoxy resin can be cast onto the oxidized copper surface and cured and the cured epoxy releases easily from the mold, yielding an epoxy surface of exceptional quality. The epoxy surface will be a precise replica of the oxidized metal surface. The surface may be flat, as for electronic applications, or it may be of some other configuration as for a telescope mirror or a reflection refraction grating.

In accordance with one embodiment of the invention, one first prepares a piece of flat glass such as float glass which has the desired degree of flatness and which is prefereably optically flat. Since the glass does not form a part of the ultimate structure, it can be of substantial thickness and therefore free from flexing as was the case of the relatively thin glass substrates hertofore used as a base for memory units. After the flat glass is prepared, a film of nickel-chromium is evaporated thereon which may be a few hundred A. thick. The function of the nickel-chromium is to provide good adhesion of the ultimate copper coating to the glass. Thereafter, a layer of about 1,000 A. thick of copper is evaporated on top of the nickel-chromium layer. The metallized glass is then heated in an oven in the presence of air at a temperature of about 120° C. for one to two hours. Thereafter an epoxy resin is cast on the oxidized copper surface and cured.

After the resin is cured, it can be lifted off of the glass surface and surface of the epoxy resin is substantially a replica of the flat glass.

In accordance with other embodiments of the invention, the mold is prepared merely by oxidizing the surface of a block of copper or silver.

BRIEF DESCRIPTION OF THE DRAWING

The sole figure of the drawing is a block diagram setting forth the various steps in carrying out the process of the present invention when using glass as the carrier for the mold.

DESCRIPTION OF THE PREFERRED EMBODIMENTS

In carrying out the present invention, it is preferred to start with a piece of relatively heavy, flat glass. Glass is selected because it is easily available in flat form and inexpensive to use as a starting material. For instance, the ordinary grade of glass known as float glass is flat enough for carrying out the present invention although a polished optical flat may be used. Metal or ceramic substrates or glass-like materials such as fused silica and the like may also be employed. Assuming that the substrate is glass, it is first plated with equal parts of an alloy of 80% nickel and 20% chromium by evaporating a layer thereon which is several hundred A. thick. On top of the nickel-chromium layer there is evaporated a thicker layer of copper, for example, about 1000 A. thick. The metallized glass is then heated to 120° C. for one to two hours to allow the formation of a thin copper oxide layer on the surface thereof. After cooling, an epoxy resin mixture is prepared and cast onto the surface of the copper. The resin can be cured at room temperature or at an elevated temperature and after it is thoroughly cured, it shows no adherence to the copper oxide layer and can then be removed without sticking, leaving a cast piece of epoxy having extremely smooth surface, substantially a replicate of the glass surface.

Instead of employing the plating technique, one can start with a solid block of metal. Thus, a copper block can be polished to a desired configuration and then placed in an oven at a temperature of about 120° C. for one or two hours which will form an oxidized copper layer on the block of copper. This forms a suitable surface for molding and the casting can be carried out as described above.

Although copper is a preferred metal because of its low cost, silver has been found to be equally suitable from a technical standpoint. Thus, one polishes the block of silver having the desired configuration and then oxidizes the surface by heating the surface in the presence of oxygen to form the oxide film. The silver oxide film forms a good, precision release surface for epoxy resins.

The following non-limiting examples illustrate preferred embodiments of the invention.

Example 1

A clean piece of float glass was first plated by evaporating a layer thereon of an alloy consisting of 80% nickel and 20% chromium to a thickness of 200 A. On top of this nickel-chromium layer there was evaporated a layer of copper about 1000 A. thick. The thus coated glass was then heated to 120° C. for one hour in air to form a thin, copper oxide layer on the surface thereof.

An epoxy resin-catalyst mixture was then prepared, consisting of six parts of Shell EPON Resin 815 and one part of Shell Hardener Z. The resin-catalyst mixture was then coated on the oxidized surface of the glass and baked at 100° C. for one hour in air. The temperature was then increased to 135° C., vacuum applied (about 30 microns Hg) and baking continued for 18 hours. The material was then removed from the vacuum chamber and cooled to room temperature. The cured resin stripped readily off of the mold leaving a fine surface on the resin of optical quality. The mold was intact and was reused.

Example 2

The process of Example 1 was repeated except there was used as a mold a solid block of copper. This was polished and heated for two hours at 120° C. to form a thin, copper oxide layer on the surface thereof. The casting and curing steps were the same as in Example 1 and a high quality casting was produced.

Example 3

A block of silver was polished and heated in air at a temperature of about 130° C. for two hours. A resin-catalyst mixture was then prepared consisting of five parts of Shell EPON Resin 828 and one part of Shell Hardener D. This mixture was then coated on the oxidized silver surface. The resin was cured as in Example 1 and removed from the mold. A high precision surface was achieved on the cured epoxy resin.

The epoxy resin substrates which are produced in accordance with the present invention are exact replicas of the oxidized metal mold surface and are of sufficient precision for use as electronic or optical components without further surface treatment. Since the epoxy resin does not stick to the mold, the mold may be reused a large number of times.

We claim:

1. The method of casting an epoxy resin comprising the steps of:

(a) preparing a copper or silver surface of the configuration desired in the ultimate resin, (b) oxidizing said surface by heating it in air to a temperature about 120° C. for from 1 to 2 hours, (c) placing an uncured epoxy resin on said oxidized surface, (d) curing said resin, and (e) removing said resin from said surface to provide an epoxy surface which is a precise replica of the oxidized metal surface.

2. The method of preparing an epoxy resin substrate in accordance with claim 1 wherein step (a) comprises: providing a piece of flat glass, coating glass with a thin layer of nickel-chromium, and coating the nickel-chromium layer with a thicker layer of copper.

3. The process of claim 2 wherein the nickel-chromium layer has a thickness of about a few hundred A. and the copper layer is about 1000 A. in thickness.

4. The process of claim 1 wherein the surface prepared in step (a) is formed from a block of copper.

5. The process of claim 1 wherein the surface prepared in step (a) is formed from a block of silver.

References Cited

UNITED STATES PATENTS

| | | | |
|---|---|---|---|
| 2,911,682 | 11/1959 | Ewald | 18—47 UX |
| 3,183,290 | 5/1965 | Guarnieri et al. | 18—47 R |
| 3,424,635 | 1/1969 | Grandinetti et al. | 264—220 X |
| 3,315,016 | 4/1967 | Wersosky et al. | 264—338 X |

FOREIGN PATENTS

| | | | |
|---|---|---|---|
| 360,743 | 11/1931 | Great Britain | 264—338 |

ROBERT F. WHITE, Primary Examiner

A. M. SOKAL, Assistant Examiner

U.S. Cl. X.R.

117—5.3; 249—115, 135; 264—337, 338